United States Patent
Barrow

[11] Patent Number: 6,118,182
[45] Date of Patent: *Sep. 12, 2000

[54] INTEGRATED CIRCUIT PACKAGE WITH RECTANGULAR CONTACT PADS

[75] Inventor: Michael Barrow, El Dorado Hills, Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/104,494

[22] Filed: Jun. 25, 1998

[51] Int. Cl.⁷ ..................................... H01L 23/48

[52] U.S. Cl. .......................... 257/773; 257/774; 257/734; 257/778; 257/779; 257/780; 257/786; 438/612; 438/613

[58] Field of Search ..................... 257/734, 772, 257/773, 780, 786, 774, 778, 737, 738; 438/612, 618, 613; 361/777; 29/843

[56] References Cited

U.S. PATENT DOCUMENTS

| | | | |
|---|---|---|---|
| 5,001,829 | 3/1991 | Schelboen | 29/840 |
| 5,444,303 | 8/1995 | Greenwood et al. | 257/786 |
| 5,471,090 | 11/1995 | Deutsch et al. | 257/734 |
| 5,477,082 | 12/1995 | Buckley et al. | 257/679 |
| 5,531,021 | 7/1996 | Kolman et al. | 29/843 |
| 5,784,262 | 7/1998 | Sherman | 361/777 |

*Primary Examiner*—Tom Thomas
*Assistant Examiner*—Luan Thai
*Attorney, Agent, or Firm*—Blakely, Sokoloff, Taylor & Zafman LLP

[57] ABSTRACT

An integrated circuit package which has a substrate that has a plurality of rectangular contact pads. Solder balls are attached to the contact pads of the substrate. The solder balls are reflowed to create solder joints which attach the substrate to a printed circuit board. The rectangular shape of the contact pads will induce a rectangular shape in the solder joints. The longitudinal axis of the contact pads and resultant solder joints may be aligned with the axes of expansion/contraction of the substrate when the package substrate is subjected to variations in temperature.

4 Claims, 2 Drawing Sheets

INTEGRATED CIRCUIT PACKAGE WITH RECTANGULAR CONTACT PADS

BACKGROUND OF THE INVENTION

1. Field of the Invention

The present invention relates to an integrated circuit package.

2. Background Information

Integrated circuits are typically assembled into a package that is soldered to a printed circuit board. There are various types of integrated circuit packages including ball grid array (BGA) packages. BGA packages include a plurality of solder balls that are attached to corresponding contact pads of a package substrate. The solder balls are reflowed to create solder joints which attach the package to the printed circuit board. The contact pads are typically circular in shape and arranged in a two dimensional array across the bottom surface of the package. An integrated circuit is mounted to the package substrate and coupled to solder balls by vias and routing traces of the substrate.

The package and circuit board are typically attached to an assembly which is exposed to an environment which may undergo variations in temperature. The changes in temperature will cause the circuit board and package to expand and contract. The thermal coefficient of expansion of the circuit board is different than the thermal expansion coefficient of the package. The difference in the thermal coefficients create stresses in the solder joints when the assembly is thermally cycled. It has been found that the stresses will induce cracks which propagate across the solder joints. The cracks may create electrical opens that render the package inoperable. It would be desirable to provide an integrated circuit package which increases the life of the solder joints over packages found in the prior art.

SUMMARY OF THE INVENTION

An embodiment of the present invention is an integrated circuit package which includes a substrate that has a plurality of rectangular contact pads.

DETAILED DESCRIPTION OF THE INVENTION

One embodiment of the present invention is an integrated circuit package which has a substrate that has a plurality of rectangular contact pads. Solder balls are attached to the contact pads of the substrate. The solder balls are reflowed to create solder joints which attach the substrate to a printed circuit board. The rectangular shape of the contact pads will induce a rectangular shape in the solder joints. The longitudinal axis of the contact pads and resultant solder joints may be aligned with the axes of expansion/contraction of the substrate when the package substrate is subjected to variations in temperature.

It has been found that cracks in the solder joints tend to propagate along the axes of expansion/contraction of the substrate. Aligning the longitudinal axis of the contact pads with the axis of expansion/contraction create a longer length for the cracks to propagate across and thus increases the life of the solder joints. Additionally, the narrow portion of the contact pads allows conductive traces to be routed between the pads. Some of the pads may be configured so that one solder ball creates a solder joint that is attached to two adjacent contact pads. The adjacent contact pads create a robust solder joint.

Figure 1:
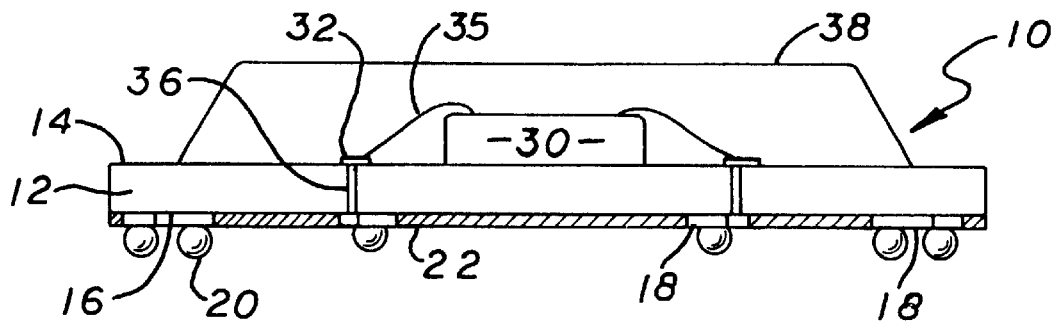
FIG. 1 is a side view of an integrated circuit package of the present invention.
Figure 2:
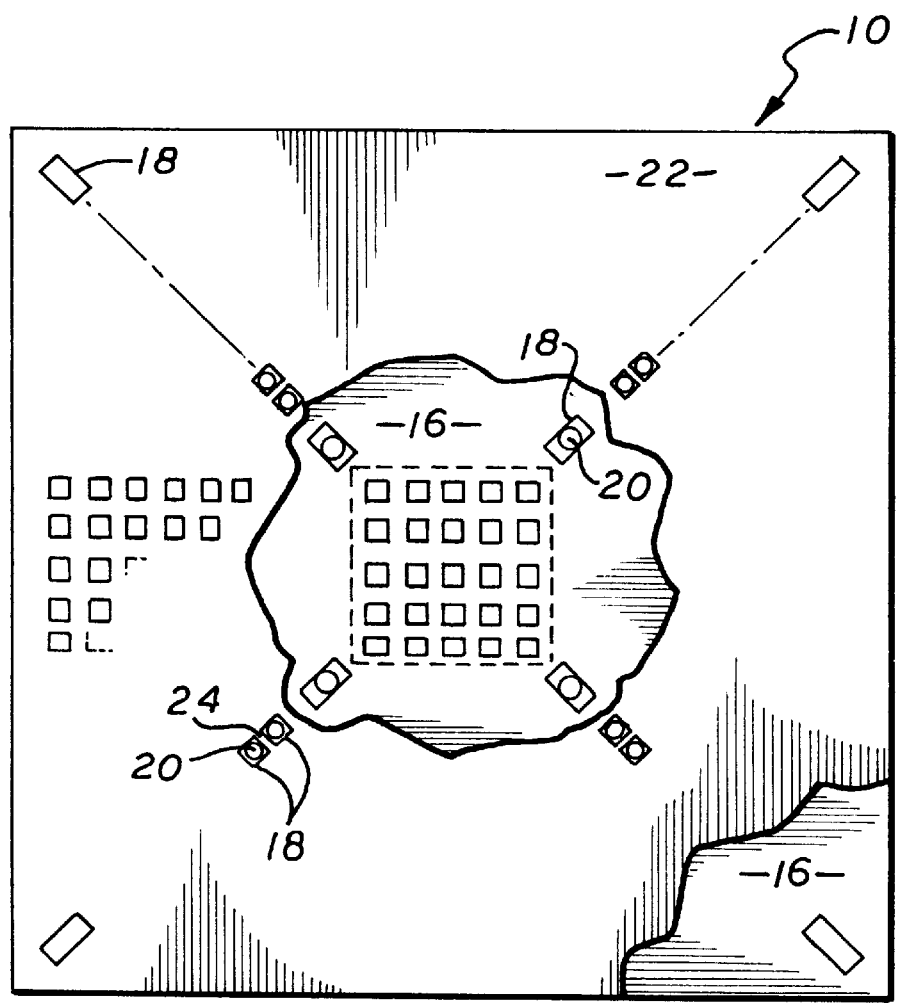
FIG. 2 is a bottom view of the integrated circuit package.

Referring to the drawings more particularly by reference numbers, FIGS. 1 and 2 show an integrated circuit package 10 of the present invention. The package 10 includes a substrate 12 which has a first surface 14 and a second surface 16. The second surface 16 has a plurality of contact pads 18. The substrate 12 may be constructed from known printed circuit board or ceramic processes.

The contact pads 18 each have a rectangular shape. Each rectangular shaped pad 18 may have a length that extends along an axis of expansion/contraction of the substrate 12. By way of example, the expansion/contraction axes of the contact pads 16 located at the corners of the substrate 12 may coincide with the diagonal axes of the second surface 16. Aligning the longitudinal axes of the contact pads 18 with the expansion/contraction axes may minimize the amount of lateral strain across the width of the pads 18. The pads 18 may each have a width that is less than the pad length to provide additional space for routing traces (not shown) on the second surface 16 of the substrate 12. Although it is to be understood that the contact pads 18 may have a square shape.

The package 10 includes a plurality of solder balls 20 that are attached to the contact pads 18. The substrate 12 typically has a layer of solder mask 22 that covers the second surface 16 except for openings 24 that expose the contact pads 18. There is typically a single solder ball 20 attached to a corresponding contact pad 16.

Figure 3:
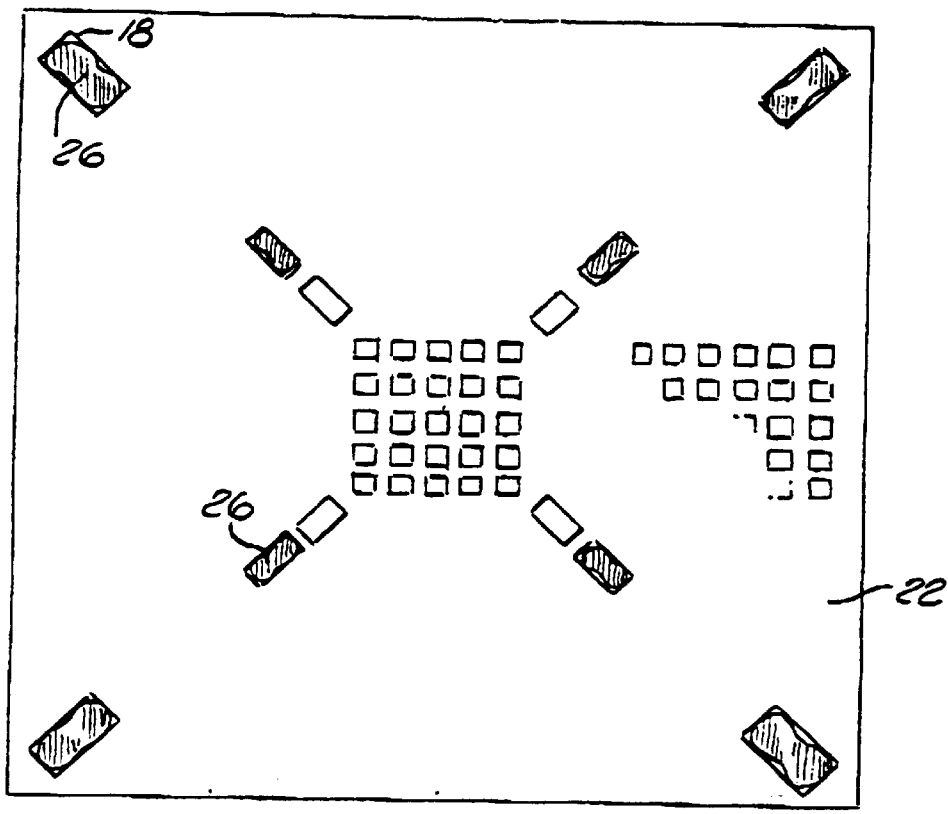
FIG. 3 is a bottom view of the integrated circuit package with a plurality of reflowed solder balls.
Figure 4:
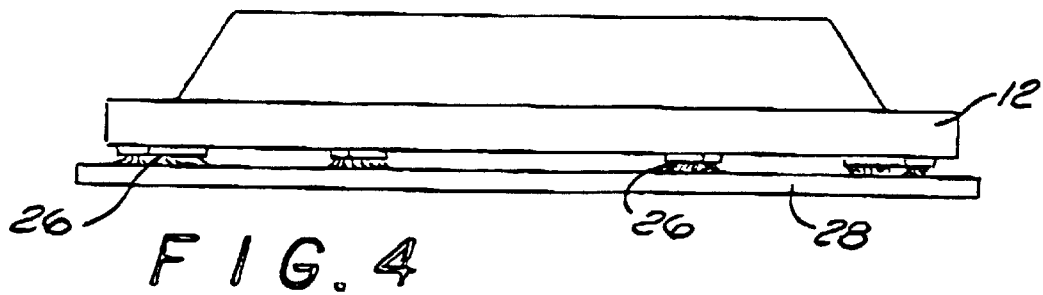
FIG. 4 is a side view showing the integrated circuit package soldered to a printed circuit board.
Figure 5:
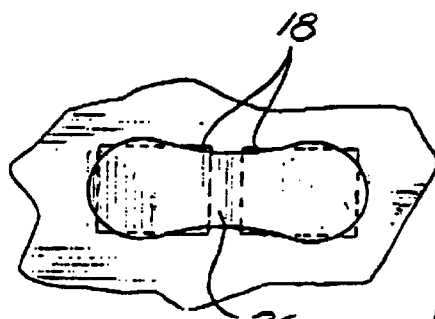
FIG. 5 is an enlarged view showing a solder joint attached to two adjacent contact pads.

As shown in FIGS. 3 and 4, the solder balls 20 are reflowed to create solder joints 26 that attach the package 10 to a printed circuit board 28. The solder typically reflows into the rectangular shape of the contact pads 18. As shown in FIG. 5, some of the contact pads 18 can be formed into close proximity with each other so that two adjacent solder balls reflow into a single solder joint 26. The single solder joint is attached to two adjacent pads 18. The solder mask openings 24 may be such as to allow solder flow between adjacent pads 18.

The rectangular solder joints 26 may provide a relatively long length in the direction of expansion/contraction and crack propagation of the joints. The additional length increases the life of the solder joints 26. This is particularly true for a solder joint 26 that is attached to two adjacent pads 16. The adjoining pads are typically located within or near the profile of an integrated circuit 30 that is mounted to the first surface 14 of the substrate 12. The stiffness of the integrated circuit 30 and the difference between thermal expansion coefficients of the circuit 30 and circuit board 28 tend to cause the greatest solder strain at the outer perimeter of the circuit profile. The adjoining solder joints provide a robust solder joint in these areas of the package 10. The adjoining contact pads 18 are typically dedicated to electrical power and/or ground which allows the pads to be shorted without interfering with the operation of the integrated circuit 30.

Referring to FIG. 1, the integrated circuit 30 may be coupled to corresponding bond pads 32 of the substrate 12 by bond wires 35. The bond pads 32 may be connected to the contact pads 18 and solder balls 22 by routing traces (not shown) and vias 36 that extend through the substrate 12. The integrated circuit 30 is typically enclosed by an injection molded plastic material 38.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a substrate which has a plurality of separated adjacent contact pads;

an integrated circuit that is mounted to said substrate; and, a single solder joint that is attached to at least two adjacent contact pads.

2. The package as recited in claim 1, wherein said contact pad has a rectangular shape.

3. The substrate as recited in claim 2, wherein said rectangular contact pad has a width that is less than a length.

4. The package as recited in claim 3, wherein at least one contact pad has a longitudinal axis that extends along an expansion/contraction axis of said substrate.

* * * * *